| (12) | United States Patent | (10) Patent No.: | US 12,249,956 B2 |
|---|---|---|---|
| | Kojo | (45) Date of Patent: | Mar. 11, 2025 |

(54) OVEN-CONTROLLED CRYSTAL OSCILLATOR

(71) Applicant: DAISHINKU CORPORATION, Kakogawa (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

(21) Appl. No.: 18/271,580

(22) PCT Filed: Feb. 21, 2022

(86) PCT No.: PCT/JP2022/006977
§ 371 (c)(1),
(2) Date: Jul. 10, 2023

(87) PCT Pub. No.: WO2022/181547
PCT Pub. Date: Sep. 1, 2022

(65) Prior Publication Data
US 2024/0072727 A1    Feb. 29, 2024

(30) Foreign Application Priority Data

Feb. 25, 2021 (JP) ................. 2021-028791

(51) Int. Cl.
| H03B 5/04 | (2006.01) |
| H03B 5/32 | (2006.01) |
| H03H 9/05 | (2006.01) |
| H03H 9/08 | (2006.01) |

(52) U.S. Cl.
CPC ............. *H03B 5/04* (2013.01); *H03B 5/32* (2013.01); *H03H 9/0552* (2013.01); *H03H 9/08* (2013.01)

(58) Field of Classification Search
CPC ........................................... H03B 5/04
USPC ........................................... 331/70
See application file for complete search history.

(56) References Cited

U.S. PATENT DOCUMENTS

| 10,812,017 | B1 | 10/2020 | Tseng et al. | |
| 2014/0292421 | A1* | 10/2014 | Kondo | H03L 1/04 |
| | | | | 331/70 |
| 2015/0135931 | A1 | 5/2015 | Yamada et al. | |
| 2015/0180481 | A1 | 6/2015 | Isohata | |
| 2016/0322952 | A1 | 11/2016 | Iizuka et al. | |
| 2017/0019110 | A1 | 1/2017 | Isohata | |
| 2017/0359075 | A1 | 12/2017 | Kikuchi | |

(Continued)

FOREIGN PATENT DOCUMENTS

| JP | 2012-205093 A | 10/2012 |
| JP | 2016-167660 A | 9/2016 |

(Continued)

*Primary Examiner* — Joseph Chang
(74) *Attorney, Agent, or Firm* — METROLEX IP LAW GROUP, PLLC; Robert L. Scott, Esq.

(57) ABSTRACT

An OCXO according to one or more embodiments may include a core section hermetically encapsulated in a heat insulation package. The core section includes: an oscillation IC; a crystal resonator; and a heater IC. The core section is supported by the package via a core substrate. The OCXO further includes a capacitor as an electronic component for adjustment, which is attached to the package by soldering. The core section is vacuum-sealed in a sealed space of the package, while the capacitor is disposed in a space other than the sealed space.

9 Claims, 8 Drawing Sheets

(56) References Cited

U.S. PATENT DOCUMENTS

| | | |
|---|---|---|
| 2018/0013386 A1 | 1/2018 | Arai |
| 2020/0235701 A1 | 7/2020 | Nomura |
| 2021/0036658 A1 | 2/2021 | Tseng et al. |

FOREIGN PATENT DOCUMENTS

| | | |
|---|---|---|
| JP | 2017-220887 A | 12/2017 |
| JP | 2018-14705 A | 1/2018 |
| JP | 2020-120159 A | 8/2020 |
| JP | 2020-123906 A | 8/2020 |
| TW | 201541861 A | 11/2015 |
| TW | I634742 B | 9/2018 |
| TW | I645664 B | 12/2018 |

\* cited by examiner

OVEN-CONTROLLED CRYSTAL OSCILLATOR

TECHNICAL FIELD

The present invention relates to oven-controlled crystal oscillators.

BACKGROUND ART

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known, in which a piezoelectric resonator is encapsulated in a thermostatic oven (for example, see Patent Documents 1 and 2).

PRIOR ART DOCUMENTS

Patent Documents

[Patent Document 1] JP 2012-205093 A
[Patent Document 2] JP 2018-014705 A

SUMMARY OF THE INVENTION

Problem to Be Solved by the Invention

As to components that have large temperature characteristics and that are encapsulated in a package as a thermostatic oven in the OCXO, a piezoelectric resonator, an oscillation IC and a heater IC are used. Apart from the above, an electronic component for adjustment such as a capacitor is needed, which is used in combination with the heater IC. In the conventional OCXOs, the electronic component for adjustment is also encapsulated in the package.

The capacitor is generally a component to be soldered, which is mounted on a substrate or the like by soldering. Also, in the OCXO, the inside of the package is generally vacuum-sealed in order to increase thermal insulation. Thus, when the component to be soldered such as a capacitor is encapsulated in the package, gas may be generated due to re-melting of the solder, which results in loss of vacuum in the package. Furthermore, the loss of vacuum in the package may cause reduction of thermal insulation of the OCXO.

The present invention was made in consideration of the above circumstances, an object of which is to provide an oven-controlled crystal oscillator capable of avoiding reducing the thermal insulation.

Means for Solving the Problem

In order to solve the above problem, an oven-controlled crystal oscillator of the present invention includes: a core section; and a heat insulation package in which the core section is hermetically encapsulated. The core section includes at least: an oscillation IC; a piezoelectric resonator; and a heater IC. The oven-controlled crystal oscillator further includes a circuit component attached to the package by a bonding material. The core section is vacuum-sealed in a sealed space of the package, and the circuit component is disposed in a space of the package other than the sealed space.

With the above-described configuration, by disposing the circuit component in a space other than the sealed space in which the core section is disposed, it is possible to avoid loss of vacuum in the sealed space due to gas generated from the bonding material (for example, solder). Thus, it is possible to maintain good thermal insulation of the oven-controlled crystal oscillator.

The above-described oven-controlled crystal oscillator may have a configuration in which the core section is supported by the package via a core substrate.

With the above-described configuration, it is possible to increase the thermal insulation of the core section by connecting the core section to the package via the core substrate.

The above-described oven-controlled crystal oscillator may have a configuration in which the core section is mounted on a first main surface of the package, and the circuit component is mounted on a second main surface of the package, which is opposite to the first main surface.

The above-described oven-controlled crystal oscillator may have a configuration in which the sealed space has a degree of vacuum not more than 10 Pa.

Also in the above-described oven-controlled crystal oscillator, the piezoelectric resonator may include: a first sealing member; a second sealing member; and a piezoelectric resonator plate having a vibrating part, the vibrating part having respective main surfaces on which excitation electrodes are formed. The first sealing member and the second sealing member may be respectively bonded to a front surface and a rear surface of the piezoelectric resonator plate in a manner of maintaining a predetermined gap. The vibrating part disposed inside may be hermetically sealed.

Also in the above-described oven-controlled crystal oscillator, the core section may have a layered structure in which the oscillation IC, the piezoelectric resonator, and the heater IC are laminated in this order from an uppermost layer side. Respective areas in plan view of the oscillation IC, the piezoelectric resonator, and the heater IC may become gradually smaller from a downside to an upside.

The above-described oven-controlled crystal oscillator may have a configuration in which the core section and the package are electrically connected to each other by wire bonding, and the piezoelectric resonator is not directly connected to the package by wire while only the oscillation IC is directly connected to the piezoelectric resonator by wire.

Effects of the Invention

An oven-controlled crystal oscillator of the present invention provides advantageous effects of preventing loss of vacuum in a sealed space caused by gas generated from a bonding material and maintaining good thermal insulation of the oven-controlled crystal oscillator.

MODE FOR CARRYING OUT THE INVENTION

Hereinafter, an embodiment of the present invention will be described in detail with reference to the drawings.

Figure 1:
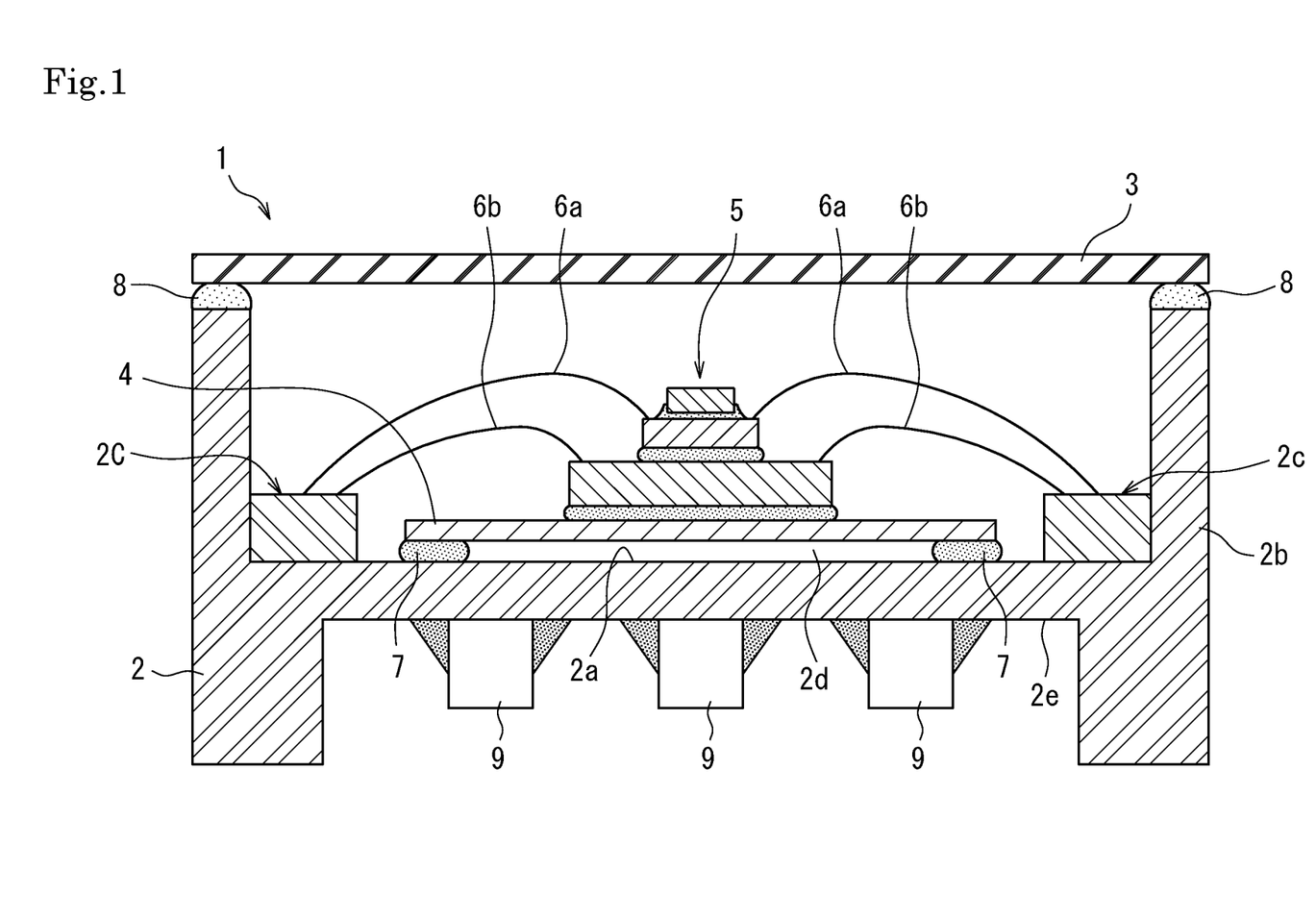
FIG. 1 is a cross-sectional view illustrating a schematic configuration of an OCXO according to an embodiment of the present invention.

As shown in FIG. 1, an OCXO 1 according to this embodiment has a configuration in which a core section 5 is disposed in a package 2 made of ceramic or the like and having a substantially rectangular parallelepiped shape such that the core section 5 is hermetically sealed by a lid 3. The package 2 includes a recess part 2a whose upper part is opened, and the core section 5 is hermetically encapsulated in the recess part 2a. To an upper surface of a peripheral wall part 2b that surrounds the recess part 2a, the lid 3 is fixed by a sealant 8. Thus, the inside of the package 2 is hermetically sealed (in an airtight state). As the sealant 8, a metal sealant such as Au-Su alloy and solder is suitably used, however, other sealants including low melting point glass may also be used. Alternatively, the sealing may be performed by seam welding with metal rings, direct seam welding without metal rings, or by beam welding. (However, note that the seam welding is preferred from the viewpoint of prevention of loss of vacuum). The space inside the package 2 is sealed in a vacuum state (for example, with the degree of vacuum not more than 10 Pa) in order to improve thermal insulation.

Step parts 2c are formed on the inner wall surface of the peripheral wall part 2b of the package 2 so as to be along the arrangement of connection terminals (not shown). The core section 5 is disposed on the bottom surface of the recess part 2a between the facing pair of step parts 2c and 2c via a plate-like core substrate 4. Alternatively, the step parts 2c may be formed to surround the four sides of the bottom surface of the recess part 2a. The core substrate 4 is bonded to the bottom surface of the recess part 2a by a non-conductive adhesive 7. A space 2d is formed under the core substrate 4. Also, external terminals (not shown) formed on the respective components of the core section 5 are connected to connection terminals formed on the step surfaces of the step parts 2c by wire bonding via wires 6a and 6b.

In this way, it is possible to increase the thermal insulation of the core section 5 by connecting the core section 5 to the package 2 via the core substrate 4 and furthermore forming the space 2d under the core substrate 4. Also, by forming the pair of step parts 2c and 2c in the package 2 so as to form the connection terminals on the step parts 2c, the connection terminals get close to an opening part of the package 2, which contributes to easy wire bonding of the core section 5 to the package 2. It is preferable that a bonding region for bonding the core substrate 4 to the package 2 (i.e. a region onto which the non-conductive adhesive 7 is applied) is not superimposed, in plan view, on a region on the front surface of the core substrate 4, on which the core section 5 is located.

The OCXO 1 includes capacitors 9 (three capacitors 9, in FIG. 1) as electronic components for adjustment that are used in combination with a heater IC 52. The capacitor 9 is a component to be soldered (circuit component), which is mounted on the package 2 by soldering. Since the capacitor 9 is the component to be soldered, when the capacitor 9 is disposed in the package 2 along with the core section 5, gas may be generated due to re-melting of the solder as the bonding material, which may cause loss of vacuum in the package 2. The loss of vacuum in the package 2 causes reduction in thermal insulation of the OCXO 1.

Taking into account the above circumstances, in the package 2 of the OCXO 1 shown in FIG. 1, a recess part 2e whose lower part is opened is formed, apart from the recess part 2a whose upper part is opened. The capacitors 9 are disposed in the recess part 2e. Unlike the components (i.e. an oscillation IC 51, a crystal resonator 50 and the heater IC 52) mounted on the core section 5, the capacitor 9 has low temperature characteristics (i.e. not likely to be affected by the temperature). Thus, the recess part 2e is not needed to be sealed by the lid or the like.

In this way, by disposing the capacitors 9 as the components to be soldered in a space other than the sealed space in which the core section 5 is disposed (i.e. the sealed space by the recess part 2a), it is possible to prevent loss of vacuum in the sealed space in which the core section 5 is disposed from occurring due to gas generated from the solder. Thus, it is possible to maintain good thermal insulation of the OCXO 1. Also, it is possible to seal, by a sealing resin, the mounting region (in this example, a part or a whole of the recess part 2e) for the circuit component (such as the capacitor 9) to be disposed outside (i.e. in the space other than the sealed space). In this case, it is also possible to increase the thermal insulation effect of the circuit component to the outer space by covering the mounting region by the sealing resin.

Also, it is possible to reduce the heat capacity in the sealed space by providing the capacitors 9 outside the sealed space in which the core section 5 is disposed. By reducing the heat capacity of the sealed space, it is also possible to control the temperature with low electric power and furthermore to improve the temperature followability of the core section 5.

Figure 2:
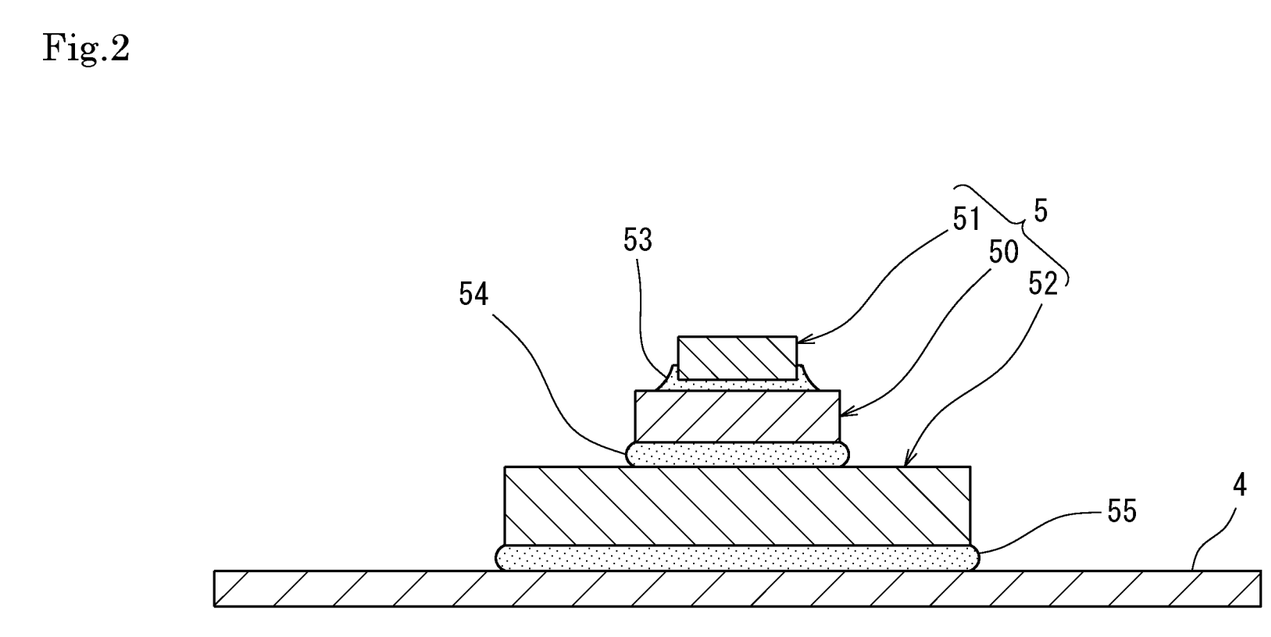
FIG. 2 is a cross-sectional view illustrating a schematic configuration of a core section and a core substrate of the OCXO of FIG. 1.

Here, the core section 5 is described referring to FIG. 2. FIG. 2 shows the core section 5 mounted on the core substrate 4. The core section 5 packages various electronic components used for the OCXO 1, and has a three-layer structure (layered structure) in which the oscillation IC 51, the crystal resonator (piezoelectric resonator) 50 and the heater IC 52 are laminated in this order from the uppermost layer side. Respective areas in plan view of the oscillation IC 51, the crystal resonator 50 and the heater IC 52 become gradually smaller from the downside to the upside. The core section 5 stabilizes oscillation frequency of the OCXO 1 by especially adjusting the temperatures of the crystal resonator 50, the oscillation IC 51 and the heater IC 52, whose temperature characteristics are large. The electronic components of the core section 5 are not sealed by a sealing resin, however, depending on the sealing atmosphere, the electronic components may be sealed by the sealing resin.

A crystal oscillator 100 is constituted of the crystal resonator 50 and the oscillation IC 51. The oscillation IC 51 is mounted on the crystal resonator 50 via a plurality of metal bumps. The oscillation frequency of the OCXO 1 is controlled by controlling the piezoelectric vibration of the crystal resonator 50 by the oscillation IC 51. The crystal oscillator 100 will be described later in detail.

Between the respective facing surfaces of the crystal resonator 50 and the oscillation IC 51, a non-conductive adhesive 53 is interposed, which fixes the respective facing surfaces of the crystal resonator 50 and the oscillation IC 51 to each other. In this case, the front surface of the crystal resonator 50 is bonded to the rear surface of the oscillation IC 51 via the non-conductive adhesive 53.

The oscillation IC 51 has the area smaller than the area of the crystal resonator 50 in plan view. Thus, the whole oscillation IC 51 is disposed within the area of the crystal resonator 50 in plan view. Also, the whole rear surface of the oscillation IC 51 is bonded to the front surface of the crystal resonator 50.

The heater IC 52 has a configuration in which a heating element (a heat source), a control circuit for controlling the temperature of the heating element (a current control circuit) and a temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1.

Between the respective facing surfaces of the crystal resonator 50 and the heater IC 52, a non-conductive adhesive 54 is interposed, which fixes the respective facing surfaces of the crystal resonator 50 and the heater IC 52 to each other. In this case, the rear surface of the crystal resonator 50 is bonded to the front surface of the heater IC 52 via the non-conductive adhesive 54.

The crystal resonator 50 has the area smaller than the area of the heater IC 52 in plan view. Thus, the whole crystal resonator 50 is disposed within the area of the heater IC 52 in plan view. Also, the whole rear surface of the crystal resonator 50 is bonded to the front surface of the heater IC 52.

Between the respective facing surfaces of the heater IC 52 and the core substrate 4, a non-conductive adhesive 55 is interposed, which fixes the respective facing surfaces of the heater IC 52 and the core substrate 4 to each other. As the non-conductive adhesives 53, 54 and 55, a polyimide adhesive or an epoxy adhesive is, for example, used.

In the core section 5 shown in FIG. 2, the external terminals for wire bonding are formed on the front surfaces of the crystal resonator 50 and the heater IC 52. The wire bonding of the crystal resonator 50 as well as the wire bonding of the heater IC 52 are not performed before mounting the core section 5 on the package 2, but are performed after mounting the core section 5 on the package 2. That is, as shown in FIG. 1, after the core section 5 is mounted on the package 2, the external terminals formed on the front surface of the crystal resonator 50 are connected to the connection terminals formed on the step surfaces of the step parts 2c via the wires 6a. Also, the external terminals formed on the front surface of the heater IC 52 are connected to the connection terminals formed on the step surfaces of the step parts 2c via the wires 6b. In this way, it is possible to perform the wire bonding efficiently by performing it after mounting the core section 5 on the package 2.

In the present invention, the crystal resonator 50 and the heater IC 52 are not necessarily required to be electrically connected to the package 2 directly by wire bonding. That is, the crystal resonator 50 and the heater IC 52 may be electrically connected to the package 2 via the core substrate 4. In this case, a relay wiring may be formed on the core substrate 4, and thus, the crystal resonator 50 and the heater IC 52 can be connected to the core substrate 4 by wire bonding or flip chip bonding. As to the connection between the core substrate 4 and the package 2, connection terminals may be formed on a surface of the package 2, which faces the core substrate 4. Thus, the respective connection terminals of the core substrate 4 and the package 2 can be connected by a conductive adhesive (that is, the conductive adhesive is used in place of the non-conductive adhesive 7 in FIG. 1). In this case, the step parts 2c in FIG. 1 are not necessarily required, and thus may be omitted.

However, it is preferable that the mechanical connection of core substrate 4 to the package 2 by the non-conductive adhesive 7 is separated from the electrical connection between the core section 5 and the package 2 by wire bonding, as shown in FIG. 1, in order to obtain high reliability in both of the mechanical connection and the electrical connection. For example, it is possible to use, as the non-conductive adhesive 7 to connect the core substrate 4 to the package 2, a flexible adhesive whose mechanical connection strength is not likely to decrease even when it is affected by external stress. As to the wire bonding between the core section 5 and the package 2, the common impedance noise is not likely to be generated by using the metal wires having a low electrical resistance, which leads to improvement of the carrier noise (CN) characteristics of the oven-controlled crystal oscillator.

Although the kind of the crystal resonator 50 used for the core section 5 is not particularly limited, a device having a sandwich structure is suitably used, which serves to make the device thinner. The device having the sandwich structure is constituted of: a first sealing member and a second sealing member both made of glass or crystal; and a piezoelectric resonator plate made of, for example, crystal. The piezoelectric resonator plate includes a vibrating part, on respective main surfaces of which excitation electrodes are formed. The first sealing member and the second sealing member are laminated and bonded via the piezoelectric resonator plate. Thus, the vibrating part of the piezoelectric resonator plate is hermetically sealed in an internal space.

Figure 3:
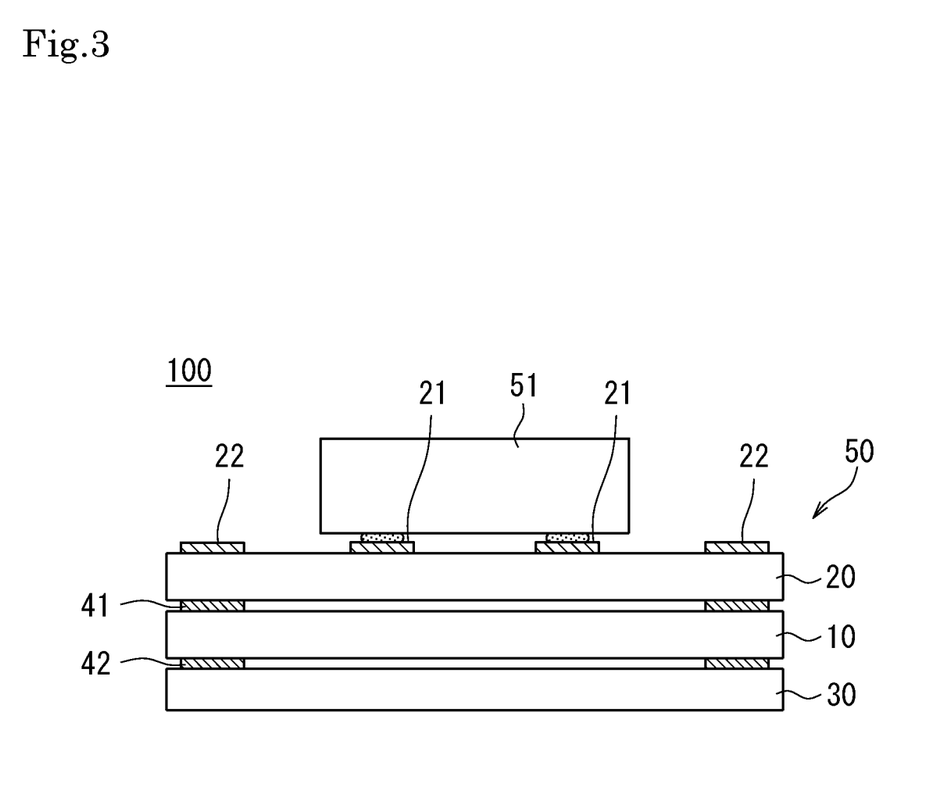
FIG. 3 is a cross-sectional view illustrating a crystal oscillator included in the core section of FIG. 2.
Figure 4:
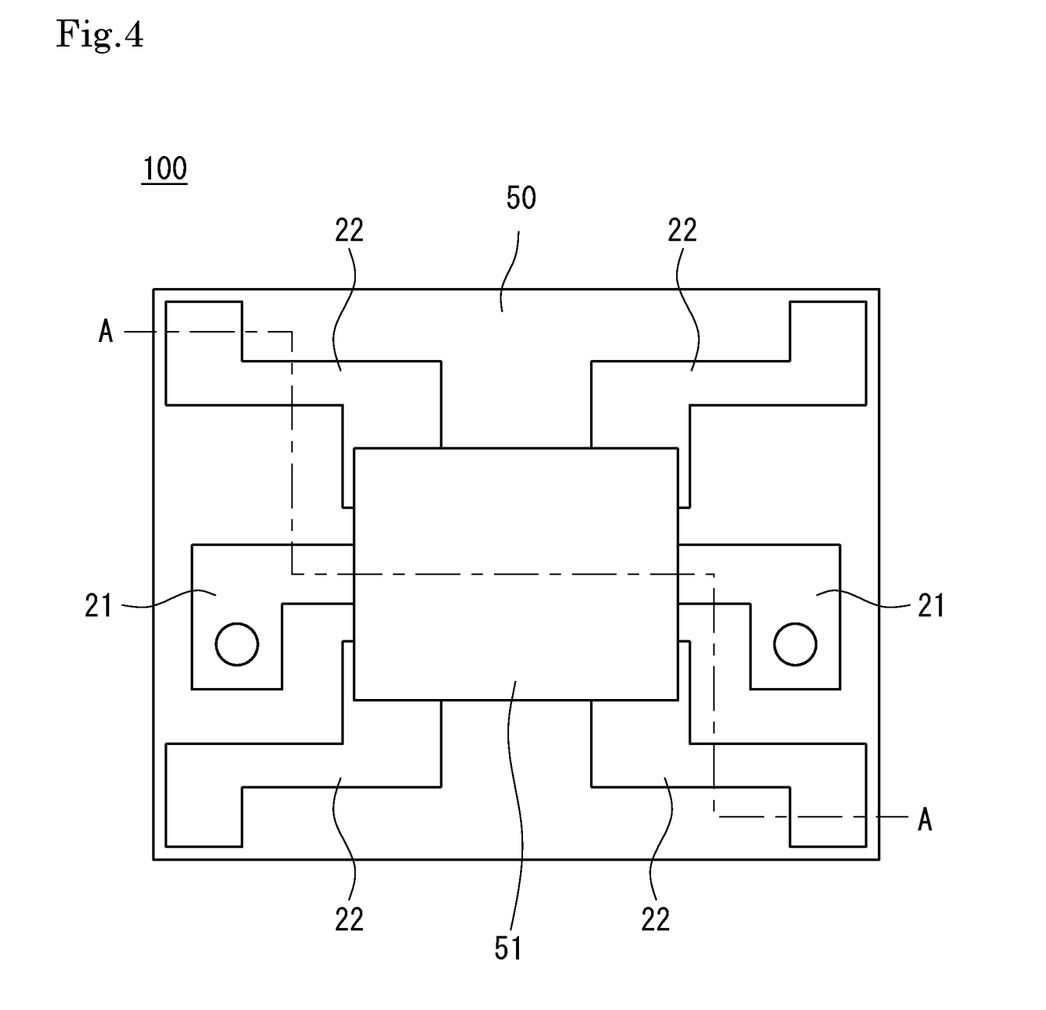
FIG. 4 is a top view illustrating the crystal oscillator included in the core section of FIG. 2.

The crystal oscillator 100 integrally formed by the sandwich-structured crystal resonator 50 and the oscillation IC 51 is exemplarily described referring to FIGS. 3 and 4. FIG. 3 is a cross-sectional view (cross-section taken along the line A-A of FIG. 4) of the crystal oscillator 100. FIG. 4 is a top view of the crystal oscillator 100. Since the sandwich-structured crystal resonator is publicly known, the detail description of the inner structure of the crystal resonator 50 is omitted here.

As shown in FIG. 3, the crystal oscillator 100 includes: a crystal resonator plate (piezoelectric resonator plate) 10; a first sealing member 20; a second sealing member 30; and the oscillation IC 51. In this crystal oscillator 100, the crystal resonator plate 10 is bonded to the first sealing member 20 by an annular-shaped seal bonding part 41, and also the crystal resonator plate 10 is bonded to the second sealing member 30 by an annular-shaped seal bonding part 42. Thus, the package having a sandwich structure is formed so as to have a substantially rectangular parallelepiped shape. The seal bonding parts 41 and 42 are respectively formed, for example, by the following procedures: forming respectively bonding patterns having a surface of an Au layer (for example, a bonding pattern formed by a Ti layer and an Au layer from the lowermost layer side) on respective bonding surfaces of the crystal resonator plate 10, the first sealing member 20 and the second sealing member 30; and performing Au—Au diffusion bonding by bonding the respective bonding surfaces. With this configuration, the gap size between the crystal resonator plate 10 and the respective sealing members 20 and 30 can be minimized to approximately 0.15 to 1 μm, which is beneficial to make the core section 5 thin and also to reduce the heat capacity of the core section 5.

Like this, in the crystal oscillator 100, an internal space (cavity) inside the package is formed by bonding the first sealing member 20 and the second sealing member 30 respectively to the main surfaces of the crystal resonator plate 10, where the vibrating part (not shown) is formed.

Thus, the vibrating part of the crystal resonator plate 10 is hermetically sealed in the internal space. The oscillation IC 51 mounted on the first sealing member 20 is a one-chip integrated circuit element constituting, with the crystal resonator plate 10, an oscillation circuit.

As shown in FIG. 4, connection terminals 21 and external terminals 22 are formed on the front surface of the crystal resonator 50. An end (outer side peripheral end) of the connection terminal 21 is electrically connected to the excitation electrode of the vibrating part (via wirings and through holes in the crystal resonator 50), and the other end (inner side peripheral end) of the connection terminal 21 is connected to the oscillation IC 51. Also, an end (outer side peripheral end) of the external terminal 22 is used for wire bonding to the package 2, and the other end (inner side peripheral end) of the external terminal 22 is connected to the oscillation IC 51. The oscillation IC 51 is connected to the connection terminals 21 and the external terminals 22 by the flip chip bonding (FCB) method using metal bumps.

Figure 5:
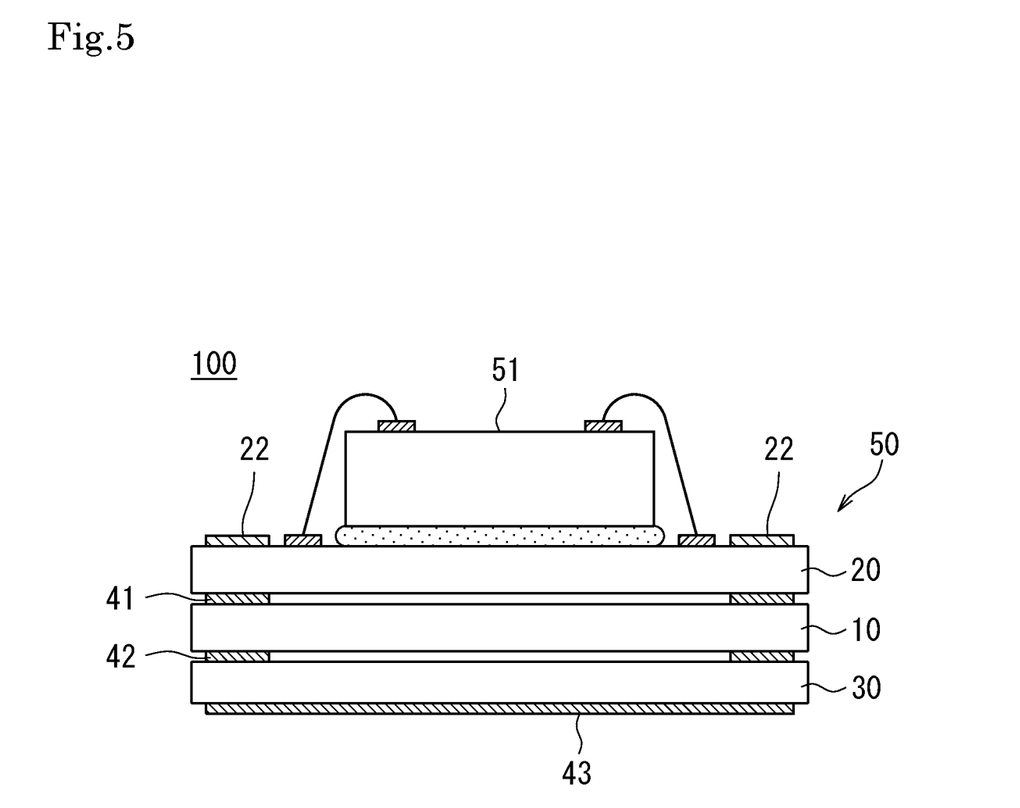
FIG. 5 is a cross-sectional view illustrating a variation of the crystal oscillator included in the core section of FIG. 2.

In the core section 5 shown in FIG. 3, the oscillation IC 51 is mounted on the crystal resonator 50 via a plurality of metal bumps 21 (i.e. by flip chip bonding). However, the present invention is not limited thereto. As shown in FIG. 5, the oscillation IC 51 may be mounted on the crystal resonator 50 by die bonding, and may be electrically connected to the crystal resonator 50 by wire bonding. Also, on the rear surface (i.e. the surface to be bonded to the heater IC 52) of the crystal resonator 50, a solid electrode 43 may be formed, to which GND potential is applied when the OCXO 1 operates.

In the configuration in which the oscillation IC 51 is mounted on the crystal resonator 50 by die bonding, the contact area between the oscillation IC 51 and the crystal resonator 50 is large compared to the configuration using the flip chip bonding, which leads to easy transfer of effect of heat generated in the oscillation IC 51 to the heater IC 52 that controls the temperature, via the crystal resonator 50. Therefore, the temperature of the core section 5 (i.e. the temperature of the oscillation IC 51, the crystal resonator 50 and the heater IC 52) can be efficiently transmitted to a temperature sensor that is provided in the heater IC 52, which results in accurate temperature control.

Originally, it is preferable that the crystal resonator 50 is not affected by the oscillation IC 51 that is a heat source other than the heater. However, it is actually difficult to avoid the heat effect by the oscillation IC 51. In this case, it is possible to easily control the temperature by efficiently transmitting the temperature change of the crystal resonator 50 caused by the oscillation IC 51 to the temperature sensor of the heater IC 52.

Figure 6:
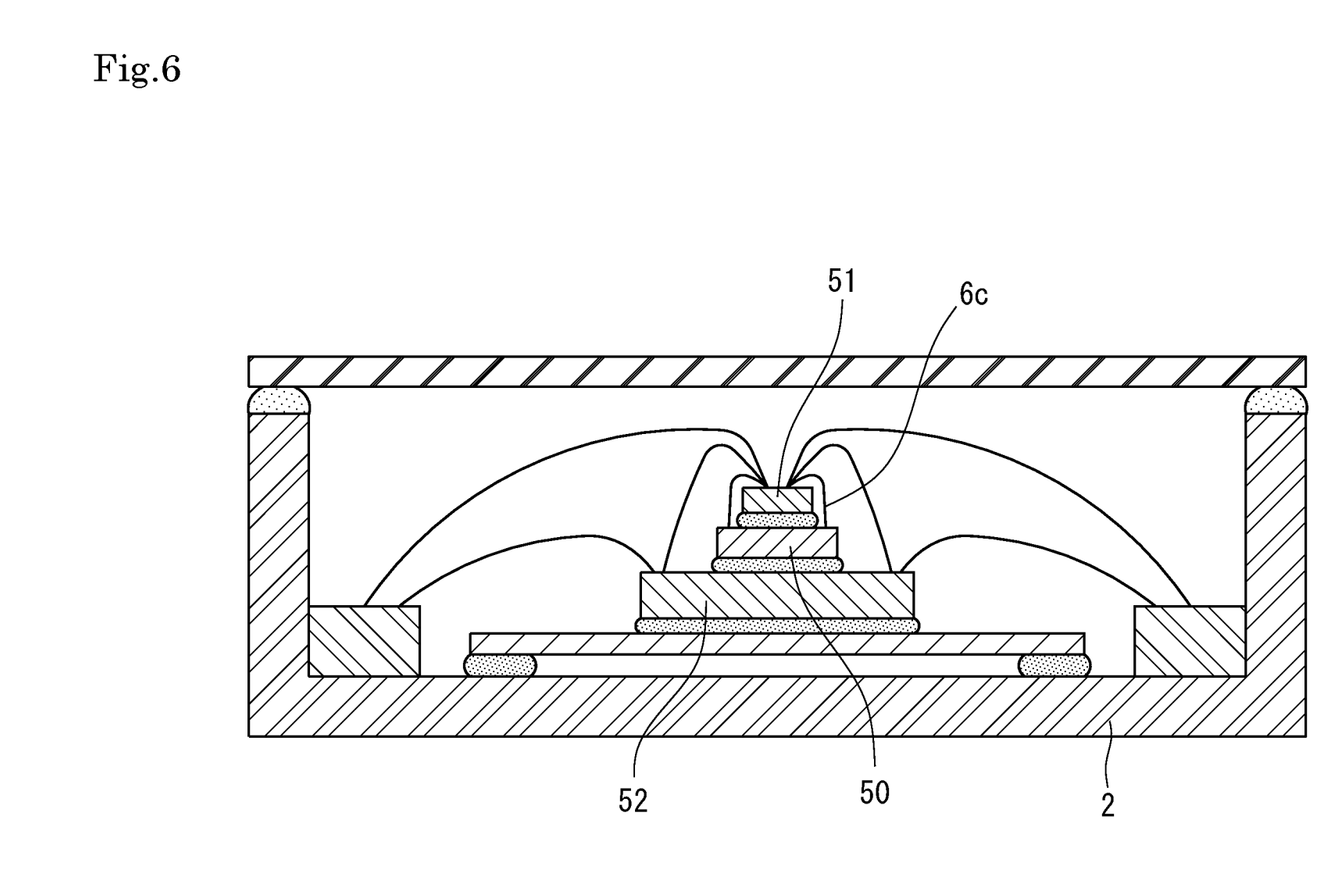
FIG. 6 is a cross-sectional view illustrating a schematic configuration of the OCXO according to a variation.

Also, when the oscillation IC 51 and the crystal resonator 50 are electrically connected to each other by wire bonding, it is preferable, in the wire bonding between the core section 5 and the package 2, that the crystal resonator 50 is not directly connected to the package 2 by wire and only the oscillation IC 51 is directly connected to the crystal resonator 50 by wire, as shown in FIG. 6. In FIG. 6, the crystal resonator 50 is connected, by wires 6c, to only the oscillation IC 51. With this configuration, it is possible to prevent the heat from escaping from the crystal resonator 50 to the package 2 via the wire. As a result, thermal insulation of the crystal resonator 50 increases, and thus temperature controllability of the crystal resonator 50 increases.

For the OCXO 1 according to this embodiment, the core section 5 is used, which is constituted of the oscillation IC 51, the crystal resonator 50 and the heater IC 52 that are layered on each other. Thus, the heat capacity of the core section 5 can be reduced. When the heat capacity of the core section 5 is reduced, it is possible to control the temperature with low electric power, and furthermore, it is possible to improve the stability of the OCXO 1 by improving the temperature followability of the core section 5. When the heat capacity of the OCXO 1 is reduced, the OCXO 1 is likely to be affected by changes in the outside temperature. However, by interposing the core substrate 4 between the core section 5 and the package 2, it is possible to reduce stress as well as heat escape.

Figure 7:
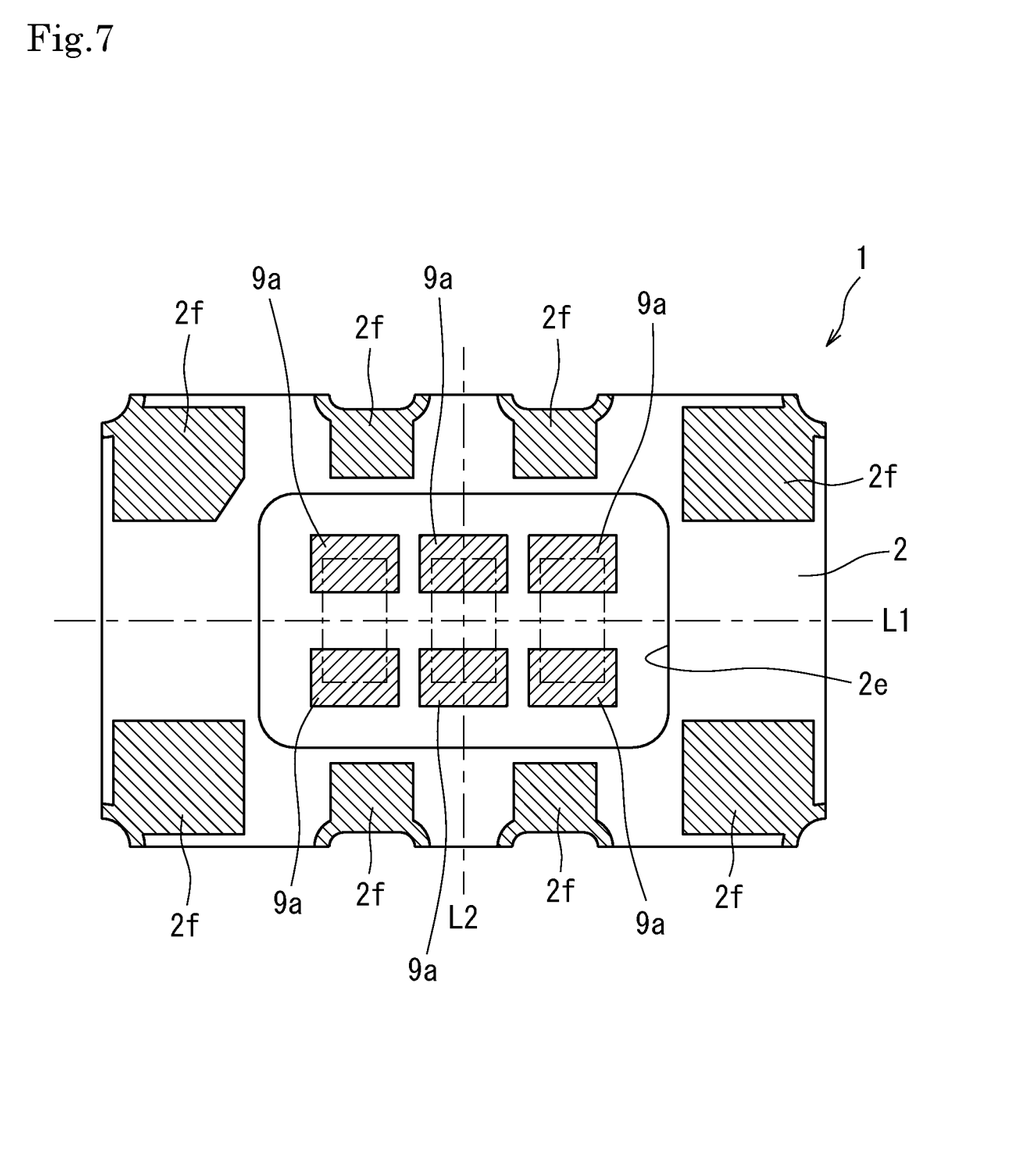
FIG. 7 is a bottom view illustrating the OCXO of FIG. 1.

In this embodiment, three capacitors 9 are mounted on a second main surface that is opposite to a first main surface of the package 2 (in this case, mounted on the bottom surface of the recess part 2e). As shown in FIG. 7, the capacitors 9 are bonded, by solder, to mounting pads 9a (mounting pads for circuit component) that are formed on the bottom surface of the recess part 2e of the package 2. In FIG. 7, the capacitors 9 are omitted, and only respective regions where the capacitors 9 are located are shown by the dashed-dotted line. A pair of mounting pads 9a and 9a is arranged so as to face each other in the short-side direction of the package 2. Both end parts of each of the three capacitors 9 in the short-side direction of the package 2 are bonded to the mounting pads 9a and 9a.

As shown in FIG. 7, three pairs of mounting pads 9a and 9a are arranged at predetermined intervals in the long-side direction of the package 2. The mounting pads 9a are located like islands on the bottom surface of the package 2. Also, the package 2 and the three capacitors 9 each have a rectangular shape in plan view, and the three capacitors 9 are arranged so as to be symmetrical with respect to a center line L1 in the short-side direction of the package 2 and a center line L2 in the long-side direction of the package 2. In this case, it is sufficient that the locations of the three capacitors 9 are linearly symmetrical with respect to the center line L1 and the center line L2. Also, on the rear surface of the package 2, a plurality of (eight, in FIG. 7) external connection terminals 2f is formed so as to electrically connect the OCXO 1 to an external circuit board (not shown) provided outside via solder or the like.

In this embodiment, since the three capacitors 9 are arranged so as to be symmetrical with respect to the center line L1 in the short-side direction of the package 2 and the center line L2 in the long-side direction of the package 2, it is possible to make uniform the heat distribution in the whole package 2. In other words, since heat transfer in the whole package 2 is not likely to be uneven, it is possible to stabilize the temperature control or the properties of the OCXO 1. Also, since the capacitors 9 are arranged in a state in which their orientations are aligned and their intervals are constant, it is possible to position and mount the capacitors 9 on the mounting region of the second main surface of the package 2 without wasted place, which improves mountability.

The number of the capacitors 9 mounted on the second surface of the package 2 is not particularly limited. The number of the capacitors 9 may be other than three. Also, a circuit component other than the capacitor 9 may be mounted on the second surface of the package 2. Furthermore, the size (volume and surface area) of each circuit component is not necessarily required to be the same.

In the example shown in FIG. 7, the three capacitors 9 are arranged so as to be linearly symmetrical with respect to both the center line L1 and the center line L2. However, the three capacitors 9 may be linearly symmetrical with respect to at least one of the center lines L1 and L2. For example, the three capacitors 9 may be linearly symmetrical with respect to only the center line L1 in the short-side direction of the package 2. Alternatively, the three capacitors 9 may be linearly symmetrical with respect to only the center line L2 in the long-side direction of the package 2. In this way, it is possible to maintain symmetry in the heat transfer in a specific side direction of the package 2, which prevents unevenness of the heat transfer. Thus, it is possible to stabilize the temperature control or the properties of the OCXO 1.

The foregoing embodiment is to be considered in all respects as illustrative and not limiting. The scope of the invention is indicated by the appended claims rather than by the foregoing description, and all modifications and changes that come within the meaning and range of equivalency of the claims are intended to be embraced therein.

For example, in the above embodiment, the crystal oscillator 100 including the sandwich-structured crystal resonator 50 is used. However, the present invention is not limited thereto. An oscillator having a structure other than the sandwich structure (for example, a surface mount device (SMD) oscillator) may be used.

Also, the number of the heaters included in the OCXO 1 is not particularly limited. The OCXO 1 may have a heater other than the heater included in the heater IC 52. Examples of this configuration include: a configuration in which a heater is further added onto the core section 5; a configuration in which a heater is added to a mounting region for a circuit component, the region provided in the package 2 on a place other than the region for the core section 5; and a configuration in which a film-shaped heater is embedded in a main body of the package 2.

In the above-described embodiment, the package 2 is an H-shaped package having different main surfaces on which the recess part 2a and the recess part 2e are respectively formed. However, the present invention is not limited thereto. It is possible to use, for example, a package for horizontal arrangement as shown in FIG. 8, or a stacked configuration of two packages.

Figure 8:
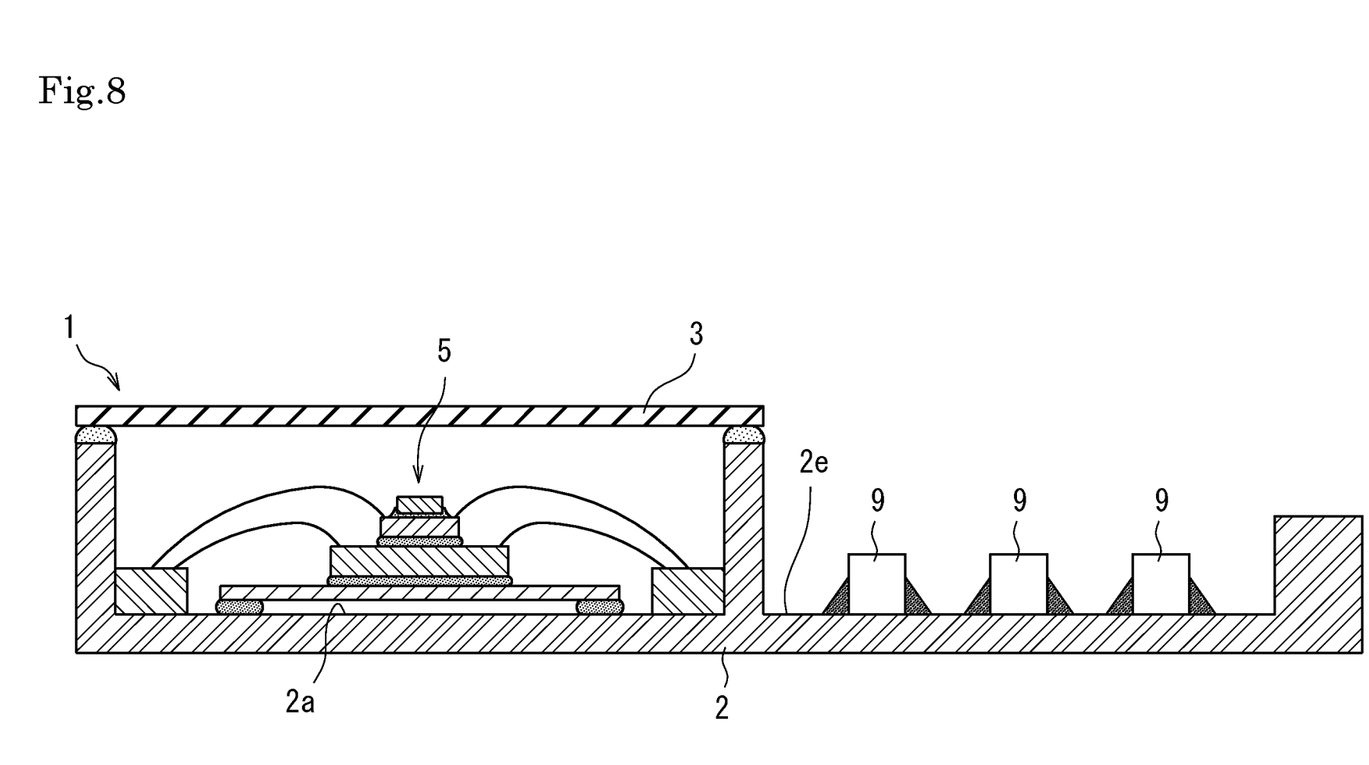
FIG. 8 is a cross-sectional view illustrating a variation of the OCXO.

In the OCXO 1 having the package for horizontal arrangement as shown in FIG. 8, the recess part 2a as a sealed space for encapsulating the core section 5 therein and the recess part 2e in which the capacitor 9 is disposed are formed so as to be arranged side-by-side on the same main surface of the package 2. Also, in the OCXO 1 having a stacked configuration of two packages, the two packages each having a recess part on only one side may be laminated in the up-down direction and electrically and mechanically connected to each other so that the upper package is hermetically sealed by the lid (not shown). In this case, the core section 5 is housed in the recess part of the upper package as shown in FIG. 1 while only the capacitors are housed in the lower package. Furthermore, as an example of another OCXO 1, it is possible to provide the configuration in which the capacitor 9 is provided on the lid 3 of FIG. 1.

Also in the package for horizontal arrangement and the stacked configuration of two packages, it is possible to dispose the capacitor 9 as the component to be soldered in a space other than the sealed space in which the core section 5 is disposed. Thus, it is also possible to obtain the effects similarly to those obtained by the OCXO 1 having the H-shaped package shown in FIG. 1.

The above-described core section 5 has a three-layer structure in which the oscillation IC 51, the crystal resonator 50 and the heater IC 52 are laminated in this order from the uppermost layer side. However, the present invention is not limited thereto. The oscillation IC 51 and the crystal resonator 50 may be horizontally placed (disposed side-by-side) on the heater IC 52. With this configuration, the crystal resonator 50 is hardly affected by the heat from the oscillation IC 51 and thus the respective temperatures of the crystal resonator 50 and the heater IC 52 are easily homogenized. Thus, it is possible to perform further accurate temperature control of the crystal resonator 50 as the temperature control target using a temperature sensor provided in the heater IC 52.

This application claims priority based on Patent Application No. 2021-028791 filed in Japan on Feb. 25, 2021. The entire contents thereof are hereby incorporated in this application by reference.

DESCRIPTION OF THE REFERENCE NUMERALS

1 OCXO (oven-controlled crystal oscillator)
2 Package
2a Recess part
2b Peripheral wall part
2c Step part
2d Space
2e Recess part
3 Lid
4 Core substrate
5 Core section
50 Crystal resonator (piezoelectric resonator)
51 Oscillation IC
52 Heater IC
53, 54, 55 Non-conductive adhesive
6a, 6b Wire
7 Non-conductive adhesive
8 Sealant
9 Capacitor (circuit component)
10 Crystal resonator plate (piezoelectric resonator plate)
20 First sealing member
21 Connection terminal
22 External terminal
30 Second sealing member
100 Crystal oscillator

The invention claimed is:

1. An oven-controlled crystal oscillator comprising: a core section; and a heat insulation package in which the core section is hermetically encapsulated, wherein
the core section includes at least: an oscillation IC; a piezoelectric resonator; and a heater IC,
the oven-controlled crystal oscillator further includes a circuit component attached to the package by a bonding material,
the core section is vacuum-sealed in a sealed space of the package,
the circuit component is disposed in a space of the package other than the sealed space, and
the core section is supported by the package via a core substrate that is a separate member from the package.

2. The oven-controlled crystal oscillator according to claim 1, wherein
the package includes a first main surface and a second main surface opposite to the first main surface, and
the core section is mounted on the first main surface, and the circuit component is mounted on the second main surface.

3. The oven-controlled crystal oscillator according to claim 1, wherein
the sealed space has a degree of vacuum not more than 10 Pa.

4. The oven-controlled crystal oscillator according to claim 1, wherein
   the piezoelectric resonator includes: a first sealing member; a second sealing member; and a piezoelectric resonator plate having a vibrating part, the vibrating part having respective main surfaces on which excitation electrodes are formed,
   the first sealing member and the second sealing member are respectively bonded to a front surface and a rear surface of the piezoelectric resonator plate in a manner of maintaining a predetermined gap, and
   the vibrating part disposed inside is hermetically sealed.

5. The oven-controlled crystal oscillator according to claim 1, wherein
   the core section has a layered structure in which the oscillation IC, the piezoelectric resonator, and the heater IC are laminated in this order from an uppermost layer side, and
   respective areas in plan view of the oscillation IC, the piezoelectric resonator, and the heater IC become gradually smaller from a downside to an upside.

6. The oven-controlled crystal oscillator according to claim 1, wherein
   the core section and the package are electrically connected to each other by wire bonding, and
   the piezoelectric resonator is not directly connected to the package by wire, and only the oscillation IC is directly connected to the piezoelectric resonator by wire.

7. The oven-controlled crystal oscillator according to claim 1, wherein
   a space is provided between the core substrate and the package.

8. The oven-controlled crystal oscillator according to claim 1, wherein
   the circuit component is attached to a recess part of the package, and furthermore is disposed in an unsealed space other than the sealed space.

9. The oven-controlled crystal oscillator according to claim 8, wherein
   the circuit component is a component to be soldered, which is mounted by soldering.

* * * * *